(12) United States Patent
Pal

(10) Patent No.: US 10,651,761 B2
(45) Date of Patent: May 12, 2020

(54) POWER CONVERTERS WITH SEGREGATED SWITCH AND DRIVE MODULES

(71) Applicant: Hamilton Sundstrand Corporation, Charlotte, NC (US)

(72) Inventor: Debabrata Pal, Hoffman Estates, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 16/131,994

(22) Filed: Sep. 14, 2018

(65) Prior Publication Data

US 2020/0091832 A1    Mar. 19, 2020

(51) Int. Cl.
  *H02M 7/00*       (2006.01)
  *H02M 7/537*      (2006.01)
  *H05K 7/20*       (2006.01)
  *H01R 25/16*      (2006.01)
  *H02M 7/483*      (2007.01)

(52) U.S. Cl.
  CPC .......... *H02M 7/003* (2013.01); *H02M 7/537* (2013.01); *H05K 7/20* (2013.01); *B64D 2221/00* (2013.01); *H01R 25/162* (2013.01); *H02M 7/483* (2013.01)

(58) Field of Classification Search
  CPC .... H02M 7/003; H02M 7/537; H01R 25/162; H02J 4/00; B64D 2221/00; H05K 7/20
  USPC ................................................. 363/146, 147
  See application file for complete search history.

(56) References Cited

U.S. PATENT DOCUMENTS

| 2003/0067748 | A1  | 4/2003  | Tamba et al. |
| 2004/0062006 | A1* | 4/2004  | Pfeifer ....................... F28F 3/12 361/699 |
| 2004/0089934 | A1* | 5/2004  | Shimoida .............. H01L 25/071 257/686 |
| 2008/0266802 | A1* | 10/2008 | Weiss .................... H01L 23/427 361/700 |
| 2012/0163057 | A1* | 6/2012  | Permuy ................. H02M 7/487 363/131 |
| 2013/0169035 | A1* | 7/2013  | Nakashima ............. H02M 1/32 307/9.1 |

(Continued)

FOREIGN PATENT DOCUMENTS

| CN | 106099574 A | 11/2016 |
| DE | 10047126 A1 | 5/2002  |

(Continued)

OTHER PUBLICATIONS

Extended European Search Report for European Patent Application No. EP19197410.4, dated Feb. 7, 2020.

*Primary Examiner* — Alex Torres-Rivera
(74) *Attorney, Agent, or Firm* — Locke Lord LLP; Scott D. Wofsy; Judy R. Naamat

(57) ABSTRACT

A phase leg for an inverter includes a switching module having a switch device, a power lead connected to the switching module and in electrical communication with the switch device, and a drive lead. The drive lead is connected to the switching module, is in electrical communication with the switch device, and is segregated from the power lead to limit heating of a drive module connected to the drive lead from current flowing through the power lead. Multilevel inverters and methods of making phase legs for inverters are also described.

16 Claims, 5 Drawing Sheets

(56) References Cited

U.S. PATENT DOCUMENTS

| | | | |
|---|---|---|---|
| 2013/0320677 A1* | 12/2013 | Yamada | H02M 3/1584 |
| | | | 290/45 |
| 2014/0252410 A1* | 9/2014 | Laschek-Enders | ............ |
| | | | H01L 29/7393 |
| | | | 257/141 |
| 2014/0284765 A1* | 9/2014 | Kiuchi | H01L 28/40 |
| | | | 257/532 |
| 2014/0319673 A1* | 10/2014 | Zhou | H01L 23/4334 |
| | | | 257/712 |
| 2016/0043616 A1* | 2/2016 | Krishnamurthy | H01L 23/3675 |
| | | | 310/64 |
| 2017/0373567 A1* | 12/2017 | Nishizono | H02K 11/33 |
| 2018/0022220 A1* | 1/2018 | Xu | H02M 7/003 |
| | | | 307/10.1 |
| 2018/0056795 A1* | 3/2018 | Xu | H03K 17/567 |
| 2018/0145604 A1 | 5/2018 | Kadota et al. | |
| 2018/0183350 A1* | 6/2018 | Kadota | H02M 7/483 |
| 2018/0337499 A1* | 11/2018 | Goebbels | H01R 25/162 |
| 2018/0373020 A1* | 12/2018 | Wang | G02B 26/001 |

FOREIGN PATENT DOCUMENTS

| | | |
|---|---|---|
| DE | 102006034351 A1 | 2/2008 |
| EP | 0805524 A1 | 11/1997 |
| EP | 1193761 A2 | 4/2002 |

\* cited by examiner

POWER CONVERTERS WITH SEGREGATED SWITCH AND DRIVE MODULES

BACKGROUND OF THE INVENTION

1. Field of the Invention

The present disclosure relates to power electrical systems, and more particularly to power converters for electrical systems having segregated switch and drive modules.

2. Description of Related Art

Electrical systems, such as aircraft electrical systems, commonly include power converters. Inverters, for example, inverters are commonly employed to convert direct current (DC) power into alternating current (AC) power for AC loads connected to the electrical system. Such inverters commonly include solid-state switch devices connected between the DC source and AC load by a power routing board and switching module, the switch devices opening and closing according to a switch signals routed through the power routing board from a gate drive electronics. DC links can be used to convert the input variable frequency AC power into DC power, which is in turn inverted into constant frequency AC power.

In some power converters, such as in high current power converters, the gate drive electronics can be subject to heating from current flowing through the power routing board. Since heat can potentially limit the expected service life of commercially available gate drive electronics cooling is commonly employed to remove heat generated by current flowing through the power routing board. Some gate drive electronics are ruggedized for use in high temperature environments, such as with specialized packaging. This can add cost to the power converter.

Such conventional methods and systems have generally been considered satisfactory for their intended purpose. However, there is still a need in the art for improved power converters, multilevel inverters, and methods of making phase legs for inverters. The present disclosure provides a solution for this need.

SUMMARY OF THE INVENTION

A phase leg for an inverter includes a switching module having a switch device, a power lead connected to the switching module and in electrical communication with the switch device, and a drive lead. The drive lead is connected to the switching module, is in electrical communication with the switch device, and is segregated from the power lead to limit heating of a drive module connected to the drive lead from current flowing through the power lead.

In certain embodiments, a direct current power source can be connected to the power lead. An alternating current power load can be connected to the power lead. The switch device can include two or more solid-state switch devices. The switch device can include two or more insulated gate bipolar transistor switch devices. A drive module can be connected to the switch device by the drive lead. In accordance with certain embodiments, the pin connector can have a switching module end and a drive module end. The drive module end can be received in the drive module. The switching module end can be received in the switching module. The drive module can be connected to directly to the switching module and without an intermediate printed wiring board (PWB). The drive lead pin connector can be a Wurth pin.

It is contemplated that a bus bar can be connected to the switching module by the power lead. A sleeve can be seated in the bus bar. The power lead can be received in the bus bar sleeve. The bus bar can include two or more layers interfused with one another. The power lead can include a pin connector, such as a Wurth pin. The pin connector can have a switching module end and an opposite bus bar end. The bus bar end of the pin connector can be received in the bus bar. The switching module end of the pin connector can be received in the switching module. The pin connector can connect the bus bar directly to the switching module and without an intermediate printed wiring board.

A multilevel inverter includes a bus bar, an A-phase leg with a phase leg as described above, and a B-phase leg as described above. The power lead of the A-phase leg includes a pin connector and connecting the power module of the A phase leg to the bus bar. The power lead of the B-phase lead also includes a pin connector and connecting the power module of the B phase leg to the bus bar. The pin connectors of both the A-phase leg and the B-phase leg connect to the bus bar without an intermediate PWB.

In certain embodiments the bus bar can include a sleeve and two or more interfused layers. The sleeve can be seated in the bus bar, and the pin connector having a switching module end and an opposite bus bar end, the bus bar end of the pin connector received in the bus bar and the switching module end of the pin connector received in the switching module. A drive module can be connected to the switch device by the drive lead. The drive lead can include a pin connector having a switching module end and a drive module end, the drive module end received in the drive module, the switching module end received in the switching module, and the drive module connected to directly to the switching module and without an intermediate PWB.

A method of making a phase leg for an inverter includes, at a switching module having a switch device, connecting a power lead to the switching module such that the power lead is in electrical communication with the switch device. A drive lead is connected to the switching module such that the drive lead is in electrical communication with the switch device and the drive lead segregated from the power lead to limit heating of a drive module connected to the drive lead from current flowing through the power lead.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION OF THE PREFERRED EMBODIMENTS

Figure 1:
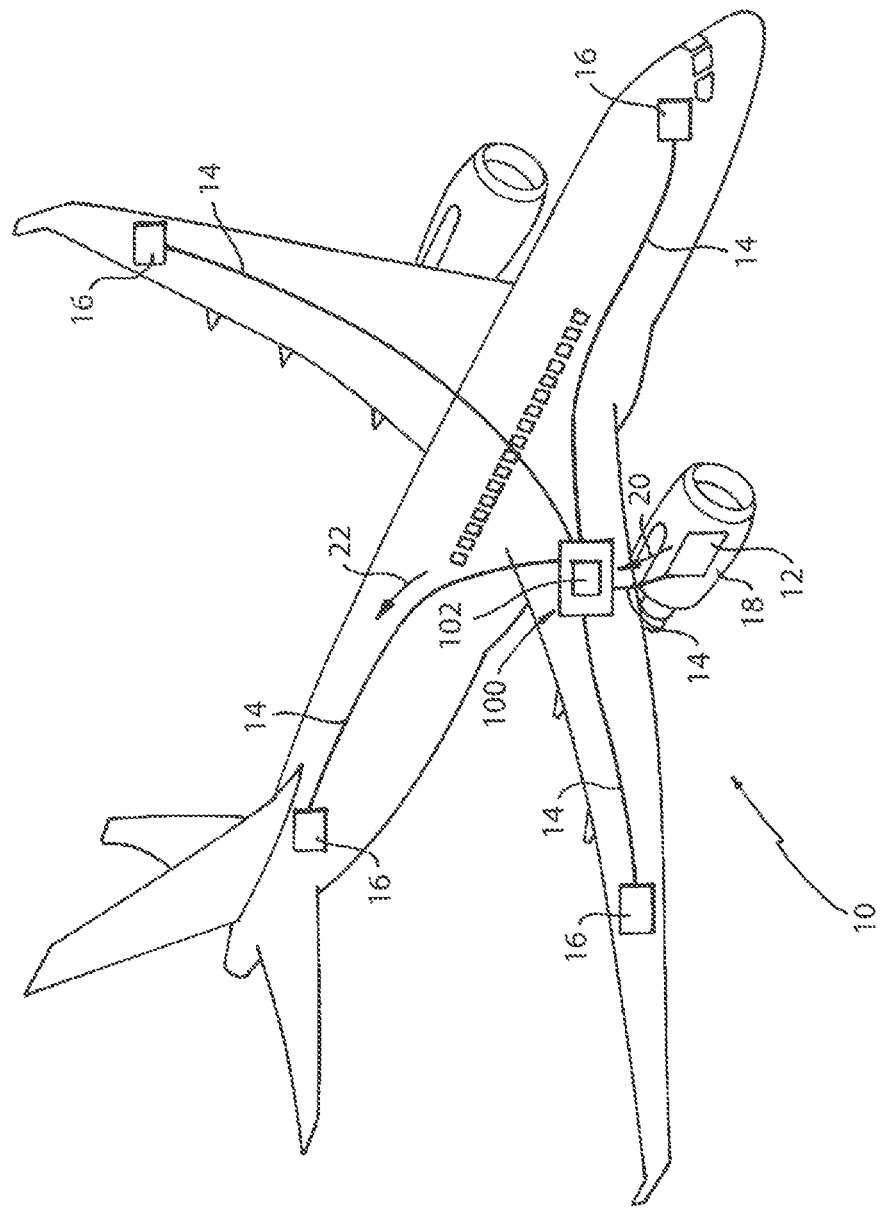
FIG. 1 is a schematic view of an exemplary embodiment of a inverter constructed in accordance with the present disclosure, showing a phase leg of the inverter connected between a power source and electrical loads in an exemplary aircraft electrical system.

Reference will now be made to the drawings wherein like reference numerals identify similar structural features or aspects of the subject disclosure. For purposes of explanation and illustration, and not limitation, a partial view of an exemplary embodiment of a multilevel inverter and phase leg for the multilevel inverter in accordance with the disclosure is shown in FIG. 1 and is designated generally by reference characters 100 and 102, respectively. Other embodiments of phase legs, multilevel inverters, and methods of making phase legs for inverters in accordance with the disclosure, or aspects thereof, are provided in FIGS. 2-5, as will be described. The systems and methods described herein can be used for electrical systems, such as in high current aircraft electrical systems, though the present disclosure is not limited to high current applications or to aircraft electrical systems in general.

Referring to FIG. 1, an electrical system 10, e.g., an aircraft electrical system, is shown. Electrical system 10 includes a generator 12, a power bus 14, and a plurality of electrical loads 16. Generator 12 is operably associated with an engine 18, e.g., an aircraft main engine or auxiliary power unit, engine 18 providing mechanical power to generator 12 to provide a flow of alternating current (AC) power 20 with a variable frequency. Power bus 14 is connected to respective electrical loads 16 through inverter 100 and phase leg 102 via an intermediate direct current (DC) link circuit 101 (shown in FIG. 2).

Figure 2:
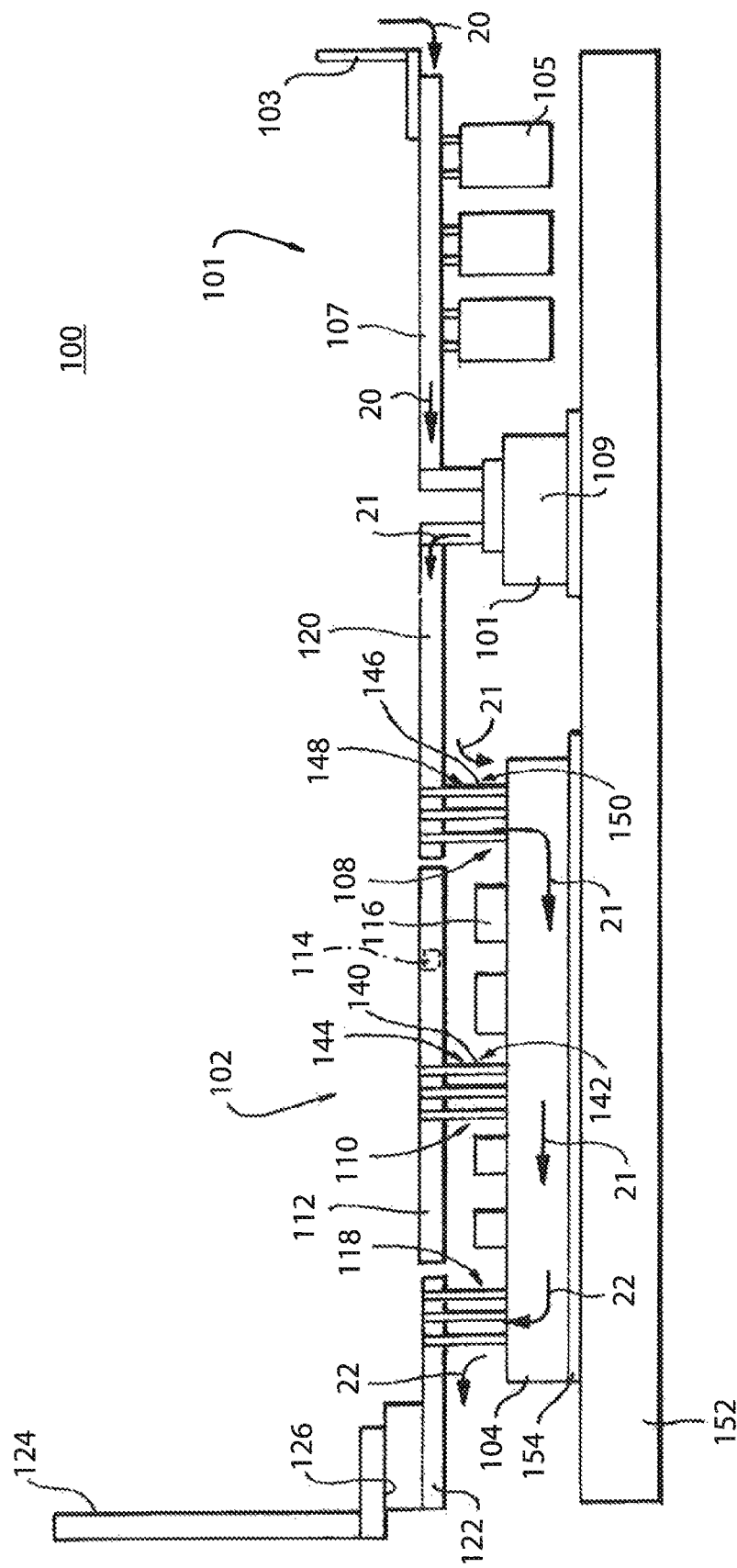
FIG. 2 is a side elevation view of the inverter of FIG. 1, showing a drive module and bus bars of the phase leg connected to a switching module such that the drive module is segregated to limit heating of the drive module by heat generated by current flowing through the inverter.

With reference to FIG. 2, inverter 100 is shown. Inverter 100 include DC link 101 and phase leg 102. DC link circuit 101 receives variable frequency AC power 20 from generator 12 (shown in FIG. 1). The variable frequency AC power 20 is converted to DC power 21 by DC link circuit 101, which DC link circuit 101 communicates to phase leg 102. Phase leg 102 converts the DC power 21 into constant frequency AC power 22, which inverter 100 communicates to electrical loads 16 (shown in FIG. 1) through power bus 14 (shown in FIG. 1). In certain embodiments inverter 100 is a multilevel inverter, e.g., a three-level inverter, though inverters having fewer or more than three levels are also contemplated.

DC link circuit 101 includes DC link input bus bar 103, a DC link bus bar 107 with DC link capacitors 105, and a rectifier 109. DC link input bus bar 103 is connected to generator 12 (shown in FIG. 1) and receives therefrom variable frequency AC power 20. DC link bus 107 is connected to rectifier 109, e.g., through a lug arrangement, and provides therethrough variable frequency AC power 20 to rectifier 109. Rectifier 109 is connected to phase leg 102, e.g., through a lug arrangement, and arranged to convert variable frequency AC power 20 into DC power 21, which rectifier 109 provides to phase leg 102 for inversion into constant frequency AC power 22.

Phase leg 102 includes a switching module 104 having a switch device, e.g., a solid-state switch device 116, an input power lead 108 connected to switching module 104 and in electrical communication with solid-state switch device 116, and a drive lead 110. Drive lead 110 is connected to switching module 104, is in electrical communication with solid-state switch device 116 therethrough, and is segregated from input power lead 108 to limit heating of a drive module 112 connected to drive lead 110 from current, e.g., DC power 21 and/or constant frequency AC power 22, flowing through input power lead 108, switching module 104, and bus bars connected to switching module 104.

Drive module 112 includes a pulse width modulation (PWM) generator 114. PWM generator 114 is configured and adapted to generate PWM drive signal for driving a solid-state switch device 116, e.g., one or more insulated gate bipolar transistor device and/or MOSFET device, mounted to switching module 104. In certain embodiments drive module 112 is a temperature-sensitive drive module, meaning that operation at temperatures approaching that of the bus bars can reduce the reliability of drive module 112. In accordance with certain embodiments drive module 112 is an off-the-shelf drive module, though customized drive modules are not excluded from the present disclosure.

Drive lead 110 connects drive module 112 to solid-state switch device 116 through switching module 104, drive lead 110 thereby operatively connecting PWM generator 114 to solid-state switch device 116. Drive lead 110 includes a pin connector 140. Pin connector 140 provides electrical communication between solid state switch devices 116 and drive module 112 while segregating drive module 112 from switching module 104. In this respect drive module 112 is spaced apart from switching module 104 by pin connectors, limiting transfer of heat generated by DC power 21 flowing through switching module 104 through drive lead 110.

Input power lead 108 connects switching module 104 to an input bus bar 120. Input bus bar 120 is in turn connected to rectifier 109 to provide DC power 21 from rectifier 109 to switching module 104. Input power lead 108 includes a pin connector 146. Pin connector 146 provides electrical communication between input bus bar 120 and switching module 104 while segregating drive module 112 from input bus bar 120. In this respect input bus bar 120 is spaced apart from switching module 104 by pin connector 146, limiting transfer of heat generated by DC power 21 through input bus bar 120 into switching module 104 through input power lead 108, thereby limiting communication of the heat to drive module 112.

An output power lead 118 connects an output bus bar 122 to switching module to communicate constant frequency AC power 22 from switching module 104 to output bus bar 122. Output power lead 118 includes a one or more pin connector 126 (shown in FIG. 3). Pin connector 126 provides electrical communication between switching module 104 and output bus bar 122 while segregating drive module 112 from output bus bar 122. In this respect output bus bar 122 is spaced apart from switching module 104 by pin connectors 126. The spacing limits transfer of heat generated by constant frequency AC power 22 communicated through one or more of output bus bar 122, an inductor 124 connected to output bus bar 122, and/or a bolted connection 156 between output bus bar 122 and inductor 124 into switching module 104 through output power lead 118, thereby limiting communication of the heat to drive module 112.

Figure 3:
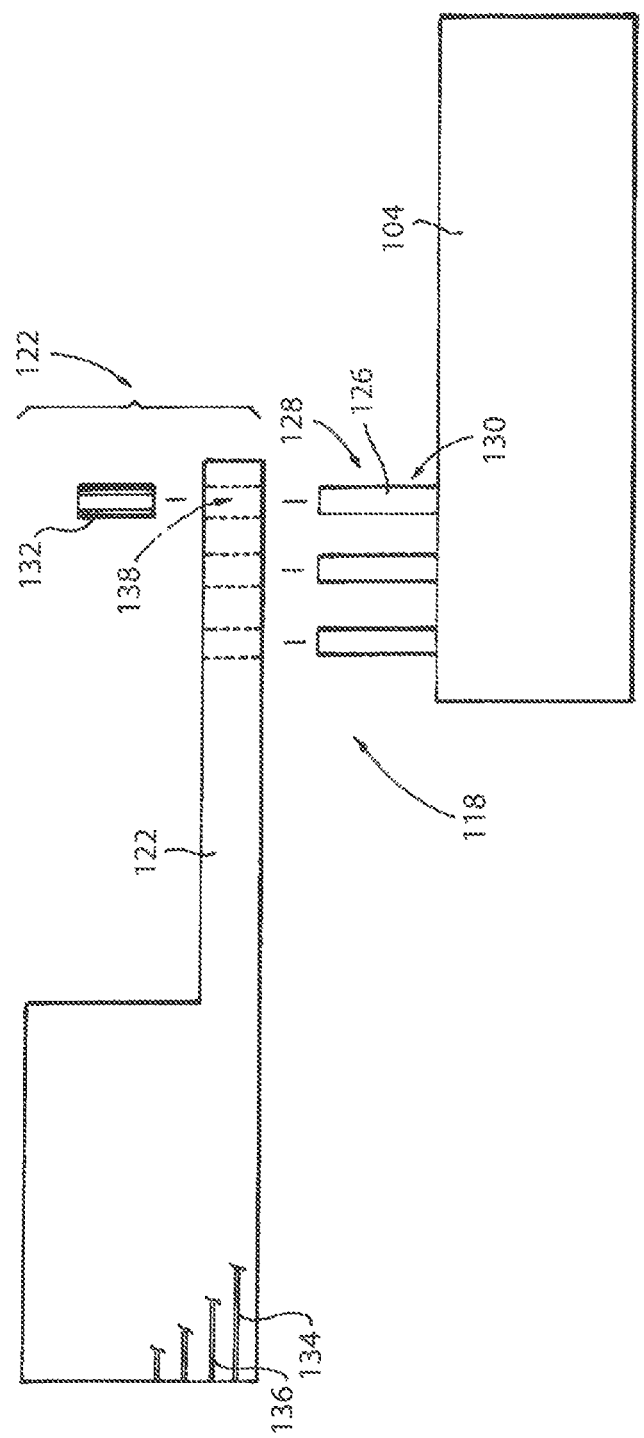
FIG. 3 is a cross-section side view of an output bus bar connecting to the phase leg of FIG. 1, showing layers of the bus bar and sleeves exploded away from the bus bar.

Referring now to FIG. 3, output power lead 118 is shown. Output power lead 118 includes a pin connector 126. Pin connector 126 has an output bus bar end 128 and a switching module end 130. Switching module end 130 is received in switching module 104 for receiving constant frequency AC power 22 (shown in FIG. 1) from switching module 104. Output bus bar end 128 is received in output bus bar 122 for providing constant frequency AC power 22 to output bus bar 122, and therethrough to inductor 124 (shown in FIG. 2).

Output bus bar 122 is connected directly to switching module 104 by pin connector 126. In this respect pin connector does not pass through an intermediate printed wiring board (PWB) arranged between output bus bar end 128 and switching module end 130. Absence of an intermediate PWB between output bus bar end 128 and switch module end 130 of pin connector 126 reduces thermal communication of heat generated in output power lead 118 that could otherwise be communicated to drive module 112 (shown in FIG. 2), output bus bar 122 and/or switching module 104 by segregating drive module 112 from switching module 104. Segregation in turn reduces (or eliminates entirely) the tendency of drive module 112 to thermally soak, allowing commercially available and off-the-shelf components to be incorporated in drive module 112 that are otherwise unsuitable due the tendency of heat to reduce the expected service life of such components.

Output bus bar 122 includes a sleeve 132 and, optionally, a first layer 134 and one or more second layer 136. The one or more second layer 136 is interfused to first layer 134 to form output bus bar 122. It is contemplated that the one or more second layer 136 be fused to first layer 134 using an additive manufacturing technique, such as powder bed fusion by way of non-limiting example. Additive manufacturing techniques allow output bus bar 122 to be formed with relative complex shapes without the material removal operations that would otherwise be required to form output bus bar 122, simplifying fabrication of output bus bar 122. Further, sleeve 132 can be incorporated into output bus bar 122 during the build, allowing connection of output bus bar 122 to switching module 104 by press fit pin connectors and without a lug and adapter arrangement.

Sleeve 132 is seated in an aperture 138 defined in output bus bar 122. It is contemplated that sleeve 132 be arranged such that pin connector 126 be fixedly received therein, e.g., without requiring soldering and/or brazing, also simplifying manufacture of phase leg 102. In certain embodiments pin connector 126 be a Wurth pin connector, sleeve 132 allowing pin connector 126 to be received in metal output bus bar 122 much in the same way that Wurth pin connectors can be used to connect to PWB structures. As shown in FIG. 3 output power lead 118 includes three (3) pin connectors 126. This is for illustration purposes only and is non-limiting. As will be appreciated by those of skill in the art in view of the present disclosure, output power lead 118 can include fewer than three pin connectors or more than three pin connectors, as suitable for an intended application. Alternatively (or additionally), foil and/or sliding contacts can also be used instead of the illustrated exemplary pressed pin contact arrangement.

With continuing reference to FIG. 2, input power lead 108 and drive lead 110 are similar in arrangement to output power lead 118, pin connector 140 of drive lead 110 additionally connecting switching module 104 to drive module 112 and pin connector 146 of input lead 108 connecting input bus bar 120 to switching module 104. Notably, drive module 112 is spaced apart from switching module 104 without an intervening PWB and that pin connectors of input power lead 108 connect switching module 104 to input bus bar 120 (shown in FIG. 2). In this respect drive lead 110 includes a pin connector 140 having a switching module end 142 and a drive module end 144, drive module end 144 received in drive module 112 and switching module end 142 received in switching module 104. Notably, pin connector 140 is thermally segregated from output bus bar 122, improving reliability of drive module 112 be reducing (or eliminating entirely) communication of heat generated by current flowing between input bus bar 120 and output bus bar 122 into drive module 112 through drive lead 110.

Pin connector 146 of input lead 108 has a switching module end 148 and an opposite bus bar end 150. Bus bar end 150 is received in input bus bar 120 and switching module end 148 is received in switching module 104 with no intervening PWB therebetween. As above, pin connector 146 is thermally segregated from input bus bar 120, improving reliability of drive module 112 be reducing (or eliminating entirely) communication of heat generated by current flowing between input bus bar 120 and output bus bar 122 into drive module 112 through input power lead 108. Although three pin connectors 146 are shown it is to be understood and appreciated that input power lead 108 can include fewer than three pin connectors 146 or more than three pin connectors, as suitable for an intended application.

To further discourage heating of drive module 112 a cold plate 152 is thermally coupled to switching module 104. As shown in FIG. 2, cold plate 152 is thermally coupled to switching module 104 on a side of switching module 104 opposite drive module 112. Coupling of cold plate 152 to switching module 104 can be, for example by way of a thermal interface layer 154 connecting cold plate 152 to switching module 104, which improves thermal communication to preferentially draw heat from switching module 104 in a direction away from drive module 112.

Figure 4:
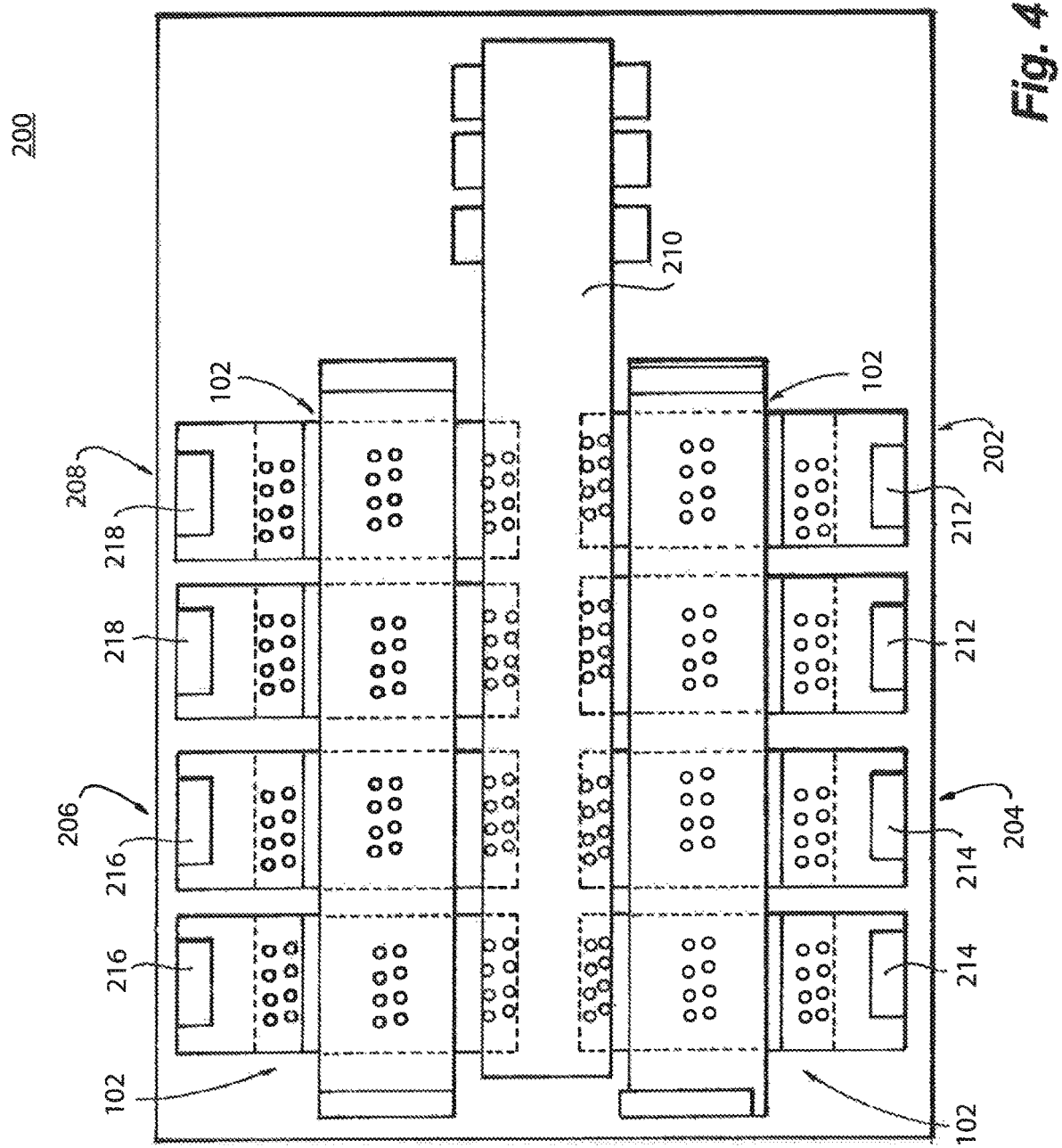
FIG. 4 is a plan view of the phase leg of FIG. 1, schematically showing the connection of the gate drive modules and bus bars to switching modules with pin connections according to an exemplary embodiment.

Referring now to FIG. 4, a multilevel inverter 200 is shown. In the illustrated exemplary embodiment multilevel inverter 200 is a three-level inverter. In this respect multiple level inverter 200 includes a neutral phase leg 202, an A-phase leg 204, a B-phase leg 206, and a C-phase 208. Each of neutral phase leg 202, A-phase leg 204, B-phase leg 206, and C-phase 208 includes a phase leg 102 connected between an input bus bar 210 and phase output bus bars, i.e., a neutral bus bar 212, an A-phase bus bar 214, a B-phase bus bar 216, and a C-phase bus bar 218. Although a three-level inverter 200 is shown in FIG. 4 it is to be understood and appreciated that the present disclosure can similarly advantage inverters with fewer than three levels or more than three levels.

Figure 5:
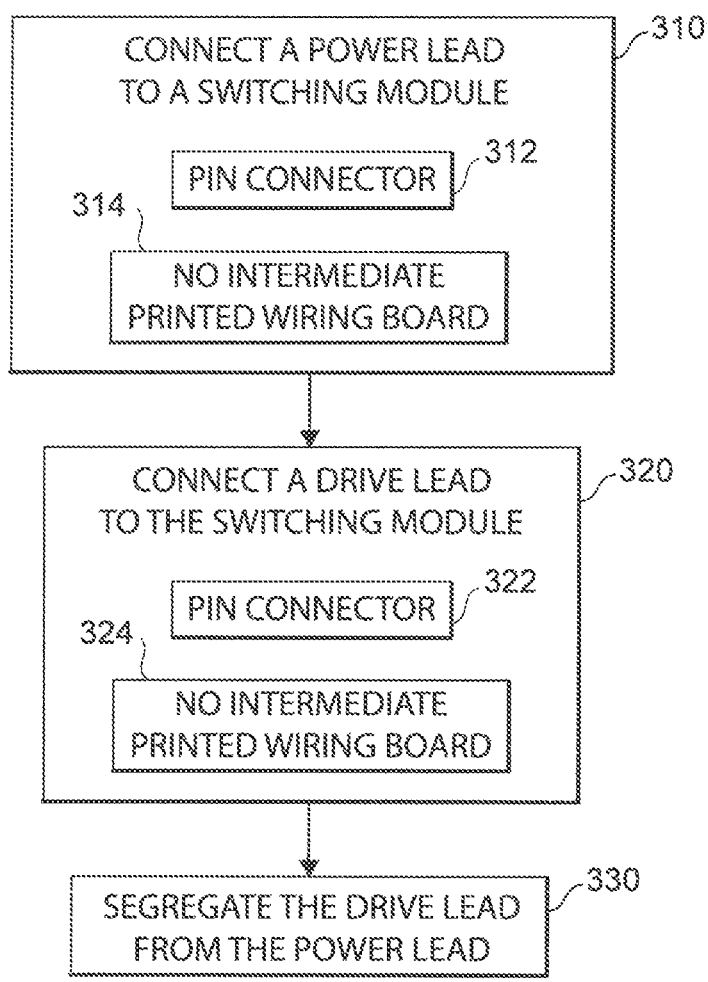
FIG. 5 is block diagram of a method of making a power converter, showing the steps of the method.

With reference to FIG. 5, a method 300 of making a phase leg for an inverter, e.g., phase leg 102 (shown in FIG. 1), is shown. Method 300 includes connecting a power lead, e.g., output power lead 118 (shown in FIG. 2), to a switching module, e.g., switching module 104 (shown in FIG. 2), having a switch device, e.g., solid-state switch device 116 (shown in FIG. 2), such that the power lead is in electrical communication with the switch device, as shown with box 310. The connection can be made with a pin connector, e.g., pin connector 126 (shown in FIG. 3), as shown with box 312. It is contemplated that the power lead can include no intervening PWB, as shown with box 314.

A drive lead, e.g., drive lead 110 (shown in FIG. 2), is connected to the switching module such that the drive lead is in electrical communication with the switch device, as shown with box 320. The connection can be made with a pin connector, e.g., pin connector 140 (shown in FIG. 2), as shown with box 322. It is contemplated that the drive lead can include no intervening PWB, as shown with box 324. The drive lead is thermally segregated from the power lead to limit heating of a drive module, e.g., drive module 112

(shown in FIG. 2), connected to the drive lead from current flowing through the power lead, as shown with box 330.

Inverters commonly employ a PWB with embedded copper traces and interconnects for receiving input power, routing power through the PWB to various switches, and providing he output power to the electrical system. The gate drive components, input bus, and output bus generally connect to one surface of the PWB such that input and output lugs connect to the copper traces in the PWB through adapters with press-fit pins for routing power through the PWB and to and from the switching module. The switching module typically connects to the opposite surface of the PWB through interconnects, which communicate input power and switching signals to the switching module from the PWB and receive therefrom the output power. While generally acceptable for its intended purposes such PWB arrangements also communicate heat from power flowing through the lugs and PWM traces to the gate drive components. In some inverters the heat communicated to the gate drive components can preclude the use of commercially available gate drive components and require the use of customized gate drive components, adding cost to the inverter.

In embodiments described herein inverters include gate drive modules with segregated power and gate drive functions. In certain embodiments the drive module is pin connected to the switching module. In accordance with certain embodiments the input bus bar and/or the output bus bar are connected to the switching module through pin connections. In accordance with certain embodiments each of the drive module, the input bus bar, and the output bus can be connected to the switching module through separate pin connections. Advantageously, this can limit (or prevent entirely) the communication of heat from either (or both) the input bus and output bus bar to the gate drive, limiting (or preventing entirely) thermal soak of the drive module. This can allow the drive module to run at relatively low temperature, enabling the inverter to employ a commercially available gate drive module. It is also contemplated that, in certain embodiments, press-fit pins can be seated directly in either (or both) the input and output bus bar to connect the bus bar to the switching module without an intervening PWB.

The methods and systems of the present disclosure, as described above and shown in the drawings, provide for power converters with superior properties including segregation of the drive module from the input and output bus bars to limit thermal communication between current carrying components, e.g., the input bus bar, the output bus bar, and the switching module, and the drive module. In certain embodiments this allows the use of commercially available drive modules in multilevel inverters, e.g., three-level inverters, reducing the cost of the power converter. In accordance with certain embodiments, the gate drive of the phase leg can also operate at a relatively low temperature for a given current flow, improving reliability of the power converter. While the apparatus and methods of the subject disclosure have been shown and described with reference to preferred embodiments, those skilled in the art will readily appreciate that change and/or modifications may be made thereto without departing from the scope of the subject disclosure.

What is claimed is:

1. A multilevel inverter, comprising:
   an input bus bar; and
   an A-phase leg and a B-phase leg, each of the A-phase and B-phase legs comprising:
   a drive module configured to receive DC power from the input bus bar and output a drive signal;
   a switching module having a switch device configured to operate on the DC power as a function of the drive signal and output a constant frequency AC power;
   an output bus bar configured to receive the constant frequency AC power, wherein the input bus bar, drive module, switching module, and output bus bar are all spaced from one another;
   a power lead connected to the switching module and in electrical communication with the switch device and the input bus bar,
   a drive lead connected to the switching module and in electrical communication with the switch device and the drive module, wherein the drive lead is segregated from the power lead to limit heating of a drive module connected to the drive lead from current flowing through the power lead; and
   an output power lead connected to the switching module and in electrical communication with the switch device and the output bus bar,
   wherein each of the power lead, drive lead, and output power lead include a pin connector for providing the respective electrical communication without an intermediate printed wiring board (PWB) and for limiting thermal communication between the input bus bar, the output bus bar, the switching module, and the drive module.

2. The phase leg as recited in claim 1, wherein the switch device includes a solid-state switch device.

3. The phase leg as recited in claim 1, wherein the switch device is an insulated gate bipolar transistor switch device.

4. The phase leg as recited in claim 1, wherein the drive lead includes a Wurth pin.

5. The phase leg as recited in claim 1, wherein the drive module is connected to the switch device by the drive lead.

6. The phase leg as recited in claim 5, wherein the pin connector of the drive lead has a switching module end and a drive module end, the drive module end received in the drive module, the switching module end received in the switching module.

7. The phase leg as recited in claim 5, wherein the drive module is connected directly to the switching module by the drive lead and without any intermediate printed wiring board.

8. The phase leg as recited in claim 1, wherein the respective pin connectors include a Wurth pin.

9. The phase leg as recited in claim 1, further comprising a direct current power source connected to the power lead.

10. The phase leg as recited in claim 1, further comprising an alternating current power load connected to the power lead.

11. The multilevel inverter as recited in claim 1, wherein the drive module is connected to the switch device by the drive lead, wherein the pin connector of the drive lead has a switching module end and a drive module end, the drive module end received in the drive module, the switching module end received in the switching module, and wherein the drive module is connected directly to the switching module and without any intermediate printed wiring board.

12. A method of making a power converter, comprising:
   providing a DC power at an input bus bar;
   for each phase leg of an A-phase leg and a B-phase leg:
   receiving the DC power from the input bus bar at a drive module and outputting a drive signal;

converting the DC power as a function of the drive signal using a switch device into a constant frequency AC power at a switching module;

connecting a power lead to the switch device such that the power lead is in electrical communication with the switch device;

connecting a drive lead to the switching module such that the drive lead is in electrical communication with the switch device;

segregating the drive lead from the power lead to limit heating of a drive module connected to the drive lead from current flowing through the power lead;

receiving the constant frequency AC power in an output bus bar that outputs the constant frequency AC power; and segregating the input bus bar, drive module, switching module, and output bus bar from one another.

13. The phase leg as recited in claim 1, wherein the input bus bar includes a sleeve seated in the input bus bar, the pin connector of the power lead received in the sleeve.

14. The phase leg as recited in claim 1, wherein the input bus bar includes a plurality of layers interfused with one another.

15. The phase leg as recited in claim 1, wherein the pin connector of the power lead has a switching module end and an opposite bus bar end, the bus bar end received in the input bus bar and the switching module end received in the switching module.

16. The phase leg as recited in claim 15, wherein the pin connector connects the input bus bar directly to the switching module and without any intermediate printed wiring board.

* * * * *